US012648483B2

(12) United States Patent
Jo et al.

(10) Patent No.: US 12,648,483 B2
(45) Date of Patent: Jun. 2, 2026

(54) DISPLAY DEVICE INCLUDING MICRO LENS COVERING LIGHT EMITTING ELEMENT AND ELECTRONIC DEVICE INCLUDING THE DISPLAY DEVICE

(71) Applicant: SAMSUNG ELECTRONICS CO., LTD., Suwon-si (KR)

(72) Inventors: A Ra Jo, Suwon-si (KR); Deukseok Chung, Suwon-si (KR); Tae-Gon Kim, Suwon-si (KR); Shang Hyeun Park, Suwon-si (KR); Min Jong Bae, Suwon-si (KR); Jong Hoon Won, Suwon-si (KR); Shin Ae Jun, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 571 days.

(21) Appl. No.: 17/973,922

(22) Filed: Oct. 26, 2022

(65) Prior Publication Data

US 2023/0126029 A1 Apr. 27, 2023

(30) Foreign Application Priority Data

Oct. 26, 2021 (KR) ........................ 10-2021-0143840

(51) Int. Cl.
*H01L 25/075* (2006.01)
*H10H 20/851* (2025.01)
(Continued)

(52) U.S. Cl.
CPC ........ *H10W 90/00* (2026.01); *H10H 20/8514* (2025.01); *H10H 20/855* (2025.01)

(58) Field of Classification Search
CPC ............... H10H 29/142; H10H 20/855; H10H 20/0361; H10H 20/8513; H10K 59/35;
(Continued)

(56) References Cited

U.S. PATENT DOCUMENTS 7,820,356 B2 10/2010 Choki et al.
8,021,825 B2 9/2011 Choki et al.
(Continued)

FOREIGN PATENT DOCUMENTS

JP 202112251 2/2021
KR 1020060124627 12/2006
(Continued)

OTHER PUBLICATIONS

Extended European Search Report dated Mar. 21, 2023, issued in corresponding European Patent Application No. No. 22203093.4.
(Continued)

*Primary Examiner* — Eliseo Ramos Feliciano
*Assistant Examiner* — Mikka Liu
(74) *Attorney, Agent, or Firm* — CANTOR COLBURN LLP

(57) ABSTRACT

Provided are a display panel, and an electronic device including display panel. The display panel includes: a substrate; a plurality of light emitting elements disposed on the substrate, each of the plurality of light emitting elements including a semiconductor light emitting chip; a plurality of micro lenses disposed on the light emitting elements, respectively, each of the micro lenses surrounding each of the light emitting elements; and a plurality of color conversion layers disposed on or under the plurality of micro lenses, respectively, each of the color conversion layers having a shape corresponding to each of the plurality of micro lenses.

15 Claims, 6 Drawing Sheets

100

(51) Int. Cl.
 *H10H 20/855* (2025.01)
 *H10W 90/00* (2026.01)

(58) Field of Classification Search
 CPC .... H10K 59/30; H10K 50/125; H10K 59/879;
 H10K 50/858; H10K 59/38
 USPC ........................................................ 257/79
 See application file for complete search history.

(56) References Cited

U.S. PATENT DOCUMENTS

| | | | |
|---|---|---|---|
| 8,053,166 B2 | 11/2011 | Choki et al. | |
| 8,054,352 B2 | 11/2011 | Kim et al. | |
| 8,420,293 B2 | 4/2013 | Choki et al. | |
| 9,111,464 B2 | 8/2015 | Bibl et al. | |
| 9,599,857 B2 | 3/2017 | Bibl et al. | |
| 9,865,577 B2 | 1/2018 | Bibl et al. | |
| 10,162,259 B2 | 12/2018 | Nam et al. | |
| 10,404,952 B2 | 9/2019 | Yoon et al. | |
| 10,676,666 B2 | 6/2020 | Kwon et al. | |
| 10,707,275 B2 | 7/2020 | Kim et al. | |
| 10,784,308 B2 | 9/2020 | Kim et al. | |
| 11,069,753 B2 | 7/2021 | Kim et al. | |
| 11,094,861 B2 | 8/2021 | Yang et al. | |
| 11,424,225 B2 | 8/2022 | Iguchi et al. | |
| 2005/0057177 A1* | 3/2005 | Lu ........................... | H10K 59/38 |
| | | | 315/169.3 |
| 2008/0258164 A1* | 10/2008 | Masui ................ | H10H 20/8515 |
| | | | 257/E33.059 |
| 2010/0041169 A1* | 2/2010 | Lee ..................... | B29C 35/0888 |
| | | | 257/E33.059 |
| 2014/0339495 A1* | 11/2014 | Bibl ..................... | H10H 20/812 |
| | | | 257/13 |
| 2014/0367633 A1* | 12/2014 | Bibl ....................... | H10K 59/38 |
| | | | 257/13 |
| 2017/0082896 A1* | 3/2017 | Jang ...................... | C09K 11/565 |
| 2018/0166612 A1* | 6/2018 | Jin .......................... | H10H 20/84 |
| 2019/0267357 A1* | 8/2019 | Iguchi ................. | H01L 25/0753 |
| 2020/0119236 A1 | 4/2020 | Yang et al. | |
| 2020/0257027 A1* | 8/2020 | Takiguchi ............. | C09B 57/007 |
| 2021/0036060 A1 | 2/2021 | Cho et al. | |
| 2021/0126154 A1 | 4/2021 | Kim et al. | |
| 2021/0151422 A1* | 5/2021 | Iguchi ................... | H01L 25/167 |

FOREIGN PATENT DOCUMENTS

| | | | |
|---|---|---|---|
| KR | 1020070112989 | | 11/2007 |
| KR | 1020090033725 | A | 4/2009 |
| KR | 1020110064264 | | 6/2011 |
| KR | 1020160010869 | | 1/2016 |
| KR | 1020160114362 | | 10/2016 |
| KR | 1020170011818 | A | 2/2017 |
| KR | 1020180019003 | A | 2/2018 |
| KR | 1020180030353 | | 3/2018 |
| KR | 101932221 | | 12/2018 |
| KR | 1020190026440 | A | 3/2019 |
| KR | 1020190055612 | | 5/2019 |
| KR | 1020200024732 | A | 3/2020 |
| KR | 1020200137977 | | 12/2020 |
| KR | 1020210014813 | | 2/2021 |
| KR | 1020210067023 | | 6/2021 |
| WO | 2016057604 | A1 | 4/2016 |
| WO | 2021176882 | A1 | 9/2021 |

OTHER PUBLICATIONS

Korean Office Action—Korean Patent Application No. 10-2021-0143840 dated Apr. 11, 2024.

* cited by examiner

DISPLAY DEVICE INCLUDING MICRO LENS COVERING LIGHT EMITTING ELEMENT AND ELECTRONIC DEVICE INCLUDING THE DISPLAY DEVICE

CROSS-REFERENCE TO RELATED APPLICATION

This application claims priority to Korean Patent Application No. 10-2021-0143840, filed on Oct. 26, 2021, and all the benefits accruing therefrom under 35 U.S.C. § 119, the content of which in its entirety is herein incorporated by reference

BACKGROUND

1. Field

The present disclosure relates to a display panel and an electronic device.

2. Description of the Related Art

An electronic device including a display panel such as a liquid crystal display panel, a plasma display panel, or an organic light emitting display panel has been commercialized.

Research on a display panel including semiconductor nanocrystals called quantum dots is being conducted in recent years.

SUMMARY

An embodiment provides a display panel including: a plurality of light emitting elements, and a plurality of color conversion layers and a plurality of micro lenses corresponding to the plurality of the light emitting elements, where an adhesive layer is not included between the plurality of the light emitting elements and the plurality of the color conversion layers or the plurality of the micro lenses, and a partition wall is not included between the plurality of the color conversion layers or between the plurality of micro lenses, thereby providing a display panel capable of improving processability and light efficiency.

Another embodiment provides an electronic device including the display panel.

A display panel according to an embodiment includes: a substrate, a plurality of light emitting elements disposed on the substrate, each of which includes a semiconductor light emitting chip; a plurality of micro lenses disposed on the light emitting elements, respectively, each of the micro lenses surrounding each of the light emitting elements; and a plurality of color conversion layers disposed on or under the plurality of micro lenses, respectively, each of the color conversion layers having a shape corresponding to each of the micro lenses.

The micro lens may include a photoinitiator.

The color conversion layer may include quantum dots.

The color conversion layer may be disposed under the micro lens to completely surround the light emitting element.

The color conversion layer may be disposed on the micro lens to completely surround the micro lens.

The display panel may further include an absorption-type color filter layer on the micro lens or on the color conversion layer.

The absorption-type color filter layer may be disposed on the micro lens to completely surround the micro lens, the color conversion layer is disposed under the micro lenses.

The absorption-type color filter layer may be disposed on the color conversion layer to completely surround the color conversion layer.

The absorption-type color filter layer may include a pigment, a dye, or a combination thereof.

The display panel may not include a partition wall anywhere between the plurality of the light emitting elements, between the micro lenses, or between the color conversion layers.

A distance between two adjacent light emitting elements among the plurality of the light emitting elements may be less than or equal to about 100 micrometers.

A central wavelength of light emitted by each of the plurality of the light emitting elements may be about 430 nanometers to about 470 nanometers.

The color conversion layer may include a first color conversion layer configured to convert light emitted from corresponding light emitting element into light having a first emission spectrum, and a second color conversion layer configured to convert light emitted from corresponding light emitting element into light having a second emission spectrum different from the first emission spectrum, and the light emitted from the corresponding light emitting element may have an emission spectrum different from the first emission spectrum and the second emission spectrum.

The first emission spectrum may be a red light emission spectrum, and the second emission spectrum may be a green light emission spectrum.

The color conversion layer may further include a transmission layer to transmit light emitted from corresponding light emitting element.

The light emitting elements surrounded by the first color conversion layer may be electrically connected to each other, and the light emitting elements surrounded by the second color conversion layer may be electrically connected to each other.

The light emitting elements on which the transmission layer is formed may be electrically connected to each other.

The plurality of the light emitting elements may include a plurality of micro light emitting diodes, and the plurality of the color conversion layers may include a plurality of first color conversion layers that include red light emitting quantum dots dispersed in a polymer matrix and surround corresponding micro light emitting diodes.

The plurality of the light emitting elements may include a plurality of micro light emitting diodes, and the plurality of the color conversion layers may include a plurality of second color conversion layer that include green light emitting quantum dots dispersed in a polymer matrix and surround corresponding micro light emitting diodes.

An electronic device according to another embodiment includes the display panel according to the embodiment.

A display panel according to an embodiment may not include a separate adhesive layer between the light emitting element and the color conversion layer, or between the color conversion layer and the micro lens, and may not also include a partition wall anywhere between the plurality of the light emitting elements, between the plurality of the color conversion layers, or between the plurality of the micro lenses. Since the display panel according to the embodiment includes a micro lens, a divergence angle of light may be adjusted to prevent color mixing between color conversion layers, and thus, partition walls between color conversion layers are not required. Since the partition wall is not required, a process time and cost for manufacturing the display panel may be reduced, and defects caused by the process may also be reduced. In addition, since the light divergence angle is adjusted to collect the light in one direction, the light efficiency may increase. Accordingly, weight reduction, miniaturization, and high integration of the device including the display panel according to the embodiment may be enabled.

BRIEF DESCRIPTION OF THE DRAWINGS

FIGS. 5 to 8 are cross-sectional views illustrating a manufacturing process of the display panel of FIG. 2.

DETAILED DESCRIPTION

Figure 1:
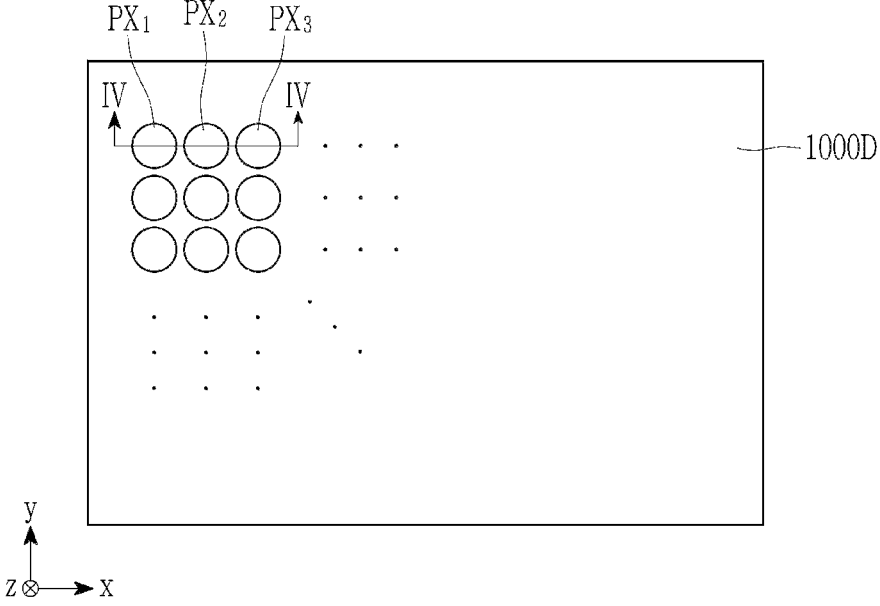
FIG. 1 is a plan view illustrating an example of a pixel arrangement of a display panel according to an embodiment.

Hereinafter, referring to the drawings, embodiments of the present invention are described in detail. In the following description of the present invention, the well-known functions or constructions may be omitted in order to clarify the present invention. The present disclosure may be embodied in several different forms, and is not limited to the embodiments described herein.

In order to clearly illustrate the present disclosure, the description and relationships are omitted, and throughout the disclosure, the same or similar configuration elements are designated by the same reference numerals. Also, since the size and thickness of each configuration shown in the drawing are arbitrarily shown for better understanding and ease of description, the present invention is not necessarily limited thereto.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items.

In the drawings, the thickness of layers, films, panels, regions, etc., are exaggerated for clarity. In addition, the thicknesses of some layers and regions are exaggerated for convenience of explanation. It will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion, and does not necessarily mean "above" in an opposite direction of gravity.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

In addition, unless explicitly described to the contrary, the word "comprise" and variations such as "comprises" or "comprising" will be understood to imply the inclusion of stated elements but not the exclusion of any other elements.

Further, in the entire specification, the term "plan view" means a view in which a target part is viewed from the top, and the term "cross-sectional view" means a view in which a cross-section of the target part that is cut in a vertical direction is viewed from the side.

Hereinafter, the term "combination" refers to a mixture and a stacked structure of two or more.

Hereinafter, a display panel according to an embodiment is described with reference to the drawings.

FIG. 1 is a plan view illustrating an example of a pixel arrangement of a display panel according to an embodiment.

Referring to FIG. 1, in a display panel 1000 according to an embodiment, a plurality of pixels PXs are arranged on a substrate 1000D.

A plurality of pixels PXs are arranged along a row (e.g., x-direction) and/or column (e.g., y-direction) on the substrate 1000D, and each pixel PX includes a plurality of subpixels $PX_1$, $PX_2$, and $PX_3$ configured to display different colors. Herein, as an example, a configuration in which three subpixels $PX_1$, $PX_2$, and $PX_3$ constitute one pixel PX is illustrated, but the configuration is not limited thereto. An additional subpixel such as a white subpixel may be further included, and one or more subpixel configured to display the same color may be included. The plurality of pixels PXs may be arranged in, for example, a Bayer matrix, a PenTile matrix, and/or a diamond matrix, but is not limited thereto.

Each of the subpixels $PX_1$, $PX_2$, and $PX_3$ may be configured to display a color of three primary colors or a combination of three primary colors, for example, red, green, blue, or a combination thereof. For example, the first subpixel $PX_1$ may be configured to display red, the second subpixel $PX_2$ may be configured to display green, and the third subpixel $PX_3$ may be configured to display blue.

In the drawing, an example in which all subpixels have the same size is illustrated, but the present disclosure is not limited thereto. At least one of the subpixels may be larger or smaller than the other subpixels. In the drawing, an example in which all subpixels have the same round shape, but the present disclosure is not limited thereto, and at least one of the subpixels may have a shape different from that of the other subpixels, for example, an oval or hexagonal shape.

Figure 2:
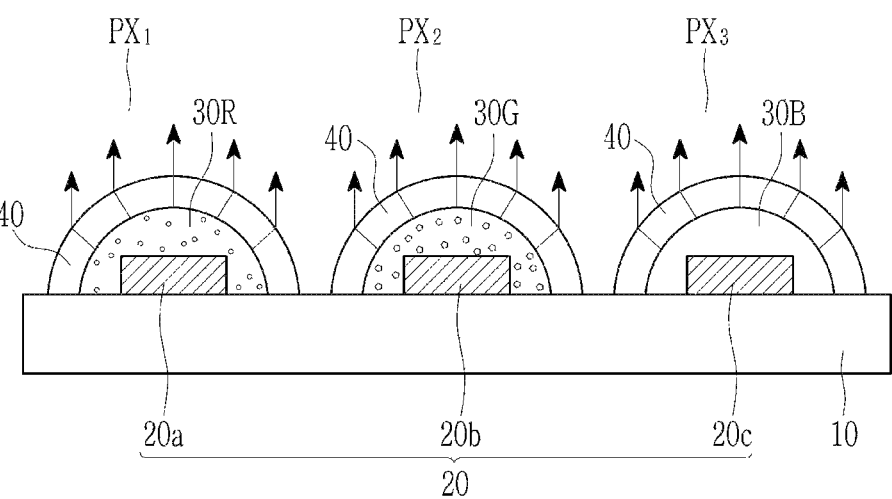
FIG. 2 is a schematic cross-sectional view of a display panel according to an embodiment.
Figure 3:
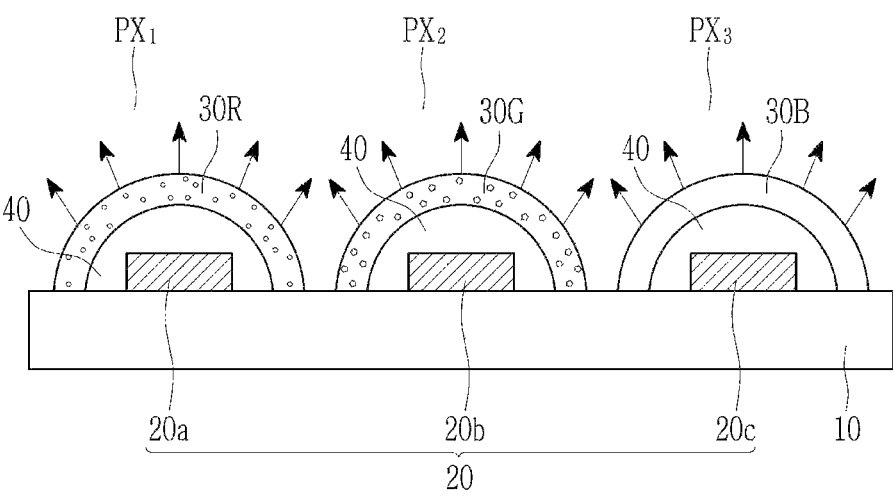
FIG. 3 is a schematic cross-sectional view of a display panel according to another embodiment.

FIGS. 2 and 3 are cross-sectional views of the display panel taken along line IV-IV of FIG. 1, respectively, showing cross-sections of the display panels according to two embodiments.

Meanwhile, although not shown in the present specification, the display panels 1000, 100, and 200 according to embodiments may include a driving unit configured to supply power to each of the light emitting elements 20a, 20b, and 20c and a control unit configured to control the light emitting elements 20a and 20b, and 20c.

Referring to FIG. 2, a display panel 100 according to an embodiment includes a substrate 10, a plurality of light emitting elements 20a, 20b, and 20c on the substrate 10, and color conversion layers 30R, 30G, and 30B formed to completely surround the light emitting elements 20a, 20b and 20c, respectively, and micro lenses 40 formed in a shape to completely surround the color conversion layers 30R, 30G, and 30B on the color conversion layers 30R, 30G, and 30B, respectively.

The substrate 10 may be a transparent substrate. For example, the substrate 10 may include an organic material, an inorganic material, or an organic-inorganic material, for example, an oxide, a nitride, an oxynitride, silicon oxide, silicon nitride, silicon oxynitride, or a combination thereof. But the material included in the substrate 10 is not limited thereto. In an embodiment, the substrate 10 may include sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), magnesium aluminum oxide ($MgAl_2O_4$), or the like. In addition, when the substrate 10 includes an organic material, it may include a polymer, for example, polyacryl, polyimide, polyamide, polyamideimide, polyethylene terephthalate, polyethylene naphthalene, polymethyl methacrylate, polycarbonate, a copolymer thereof, or a combination thereof, but the organic material is not limited thereto.

A plurality of light emitting elements 20a, 20b, and 20c may be disposed on the substrate 10. A plurality of light emitting elements 20a, 20b, and 20c may be disposed for subpixel $PX_1$, $PX_2$, and $PX_3$, respectively, and the light emitting elements 20a, 20b, and 20c disposed in the subpixels $PX_1$, $PX_2$, and $PX_3$, respectively, may be independently driven by applied power or a driving signal to emit light. The light emitting elements 20a, 20b, and 20c may include, for example, a semiconductor light emitting chip such as a light emitting diode ("LED"), and may include a pair of electrodes and a light emitting layer between the pair of electrodes. The light emitting layer may include a light emitting body capable of emitting light of a predetermined wavelength region, for example, a light emitting body that emits light of an emission spectrum belonging to a visible light wavelength spectrum, for example, blue light. The light emitting body may include an organic light emitting body, an inorganic light emitting body, an organic-inorganic light emitting body, or a combination thereof, and may be one type or two or more types.

The light emitting elements 20a, 20b, and 20c may be, for example, an organic light emitting diode ("OLED"), an inorganic light emitting diode, or a combination thereof. The inorganic light emitting diode may be, for example, a quantum dot light emitting diode, a perovskite light emitting diode, a micro light emitting diode, an inorganic nano light emitting diode, or a combination thereof, but is not limited thereto.

In an embodiment, the light emitting elements 20a, 20b, and 20c may be micro light emitting diodes (hereinafter, also referred to as "μLEDs"). In this case, a pitch between adjacent light emitting elements, that is, a distance between each center of two adjacent light emitting elements may be less than or equal to about 100 micrometers. A specific stacked structure of the light emitting element 20 according to an embodiment is described later with reference to FIG. 4.

In an embodiment, a central wavelength of light emitted from the light emitting elements 20a, 20b, and 20c may be about 430 nanometers to about 470 nanometers, for example, from about 440 nanometers to about 460 nanometers, but is not limited thereto.

Meanwhile, the plurality of the light emitting elements may be electrically connected to each other. For example, a plurality of light emitting elements, under the color conversion layers that convert light having a specific emission spectrum emitted from the light emitting elements into light having another specific emission spectrum, may be electrically connected to each other. For example, a plurality of light emitting elements 20a surrounded by and disposed under the color conversion layers 30R that convert blue light emitted from the light emitting elements 20a into red light may be electrically connected to each other. Also, for example, a plurality of light emitting elements 20b surrounded by and disposed under color conversion layers 30G that convert blue light emitted from the light emitting elements 20b into green light may be electrically connected to each other. Furthermore, a plurality of light emitting elements 20c surrounded by and disposed under the color conversion layers 30B or the transmission layers 30B that transmit blue light emitted from the light emitting elements 20c as it is without converting the blue light into light of different wavelengths may be electrically connected to each other. Through these connections, the light emitting elements in the region emitting light of the same color may be simultaneously driven. Accordingly, as will be described later, in manufacturing a display panel according to an embodiment, in order to form a color conversion layer having a specific emission spectrum, light emitting elements under the color conversion layers may selectively be driven at the same time.

A protective layer (not shown) may be disposed on the light emitting elements 20a, 20b, and 20c. The protective layer may be an inorganic material or an organic material. When the protective layer includes an inorganic material, the inorganic material may include silicon oxide or silicon nitride. The protective layer may have substantially the same shape as the plurality of the light emitting elements 20a, 20b, and 20c, and may be a layer by which each of the plurality of the light emitting elements 20a, 20b, and 20c is coated very thinly. Such a protective layer may not be present.

Each of the color conversion layers 30R, 30G, and 30B is formed to surround each of the light emitting elements 20a, 20b, and 20c (on the protective layer, if present). Specifically, the color conversion layer 30R is formed to substantially completely surround the light emitting element 20a, the color conversion layer 30G is formed to substantially completely surround the light emitting element 20b, and the color conversion layer 30B is formed to substantially completely surround the light emitting element 20c. Herein, "substantially completely surround" means that the color conversion layers 30R, 30G, and 30B surround the entire surfaces of the light emitting elements 20a, 20b, and 20c, respectively, except for portions by which the light emitting elements 20a, 20b, and 20c are in contact with the substrate. That is, it does not mean that the color conversion layers 30R, 30G, and 30B simply cover the upper surfaces of the light emitting elements 20a, 20b, and 20c.

Each of the color conversion layers 30R, 30G, and 30B may convert an emission spectrum of light emitted from each of the light emitting elements 20a, 20b, and 20c into light with a different emission spectrum, and may convert, for example, an emission spectrum of light emitted from the light emitting elements 20a, 20b, and 20c into light having an emission spectrum of a color displayed by each of the subpixels $PX_1$, $PX_2$, and $PX_3$. Each of the color conversion layers 30R, 30G, and 30B may include a color converter that converts light having a specific emission spectrum supplied from each of the light emitting elements 20a, 20b, and 20c into light having another specific emission spectrum. The color converter may include, for example, a quantum dot, a phosphor, or a combination thereof. In an embodiment, the color converter may include a quantum dot.

The quantum dot may have a photoluminescence characteristic of receiving light of a predetermined emission spectrum and emitting light of a longer wavelength spectrum. Since the quantum dot has isotropic light emission characteristics, it may emit light in all directions, thereby exhibiting an improved optical viewing angle.

The quantum dot may have various shapes, such as, for example, a spherical shape, a pyramidal shape, a multi-arm, a cubic shape, a quantum rod, and a quantum plate. The quantum dot, for example, may have a particle diameter of about 1 nanometer (nm) to about 100 nm (the size of the longest portion if not spherical), and for example, may have a particle diameter of about 1 nm to about 80 nm, for example about 1 nm to about 50 nm, or for example, about 1 nm to about 20 nm.

Energy bandgap of quantum dot may be controlled by adjusting the size and/or composition thereof, and thus the emission wavelength may also be adjusted. For example, as the size of the quantum dot increases, it may have a narrow energy bandgap, and thus may emit light of a relatively long wavelength spectrum. As the size of the quantum dot decreases, the energy bandgap becomes wider, and thus may emit light of a relatively short wavelength spectrum.

For example, according to a size and/or composition thereof, the quantum dot may emit light of, for example, a predetermined wavelength spectrum among the visible light wavelength spectrum. For example, the quantum dot may selectively emit light in one of a red light emission spectrum, a green light emission spectrum, and a blue light emission spectrum. The light in the red light emission spectrum may have a maximum emission wavelength, for example, in about 610 nm and about 670 nm, the light of the green light emission spectrum may have a maximum emission wavelength, for example, in about 520 nm to about 560 nm, and the light in the blue light emission spectrum may have a maximum emission wavelength, for example, in about 420 nm to about 480 nm. For example, light having a plurality of wavelength spectra may be emitted by including two or more types of quantum dots of different sizes and/or compositions. For example, two or more types of quantum dots of different sizes and/or compositions may be mixed or stacked to emit white light.

The quantum dot may have a relatively narrow full width at half maximum ("FWHM"). Herein, the full width at half maximum is the width of a wavelength corresponding to half of the maximum emission point, and when the full width at half maximum is small, light in a narrow wavelength region may be emitted, which indicates high color purity. The quantum dot may have, for example, a full width at half maximum of less than or equal to about 50 nm, and within the above range, for example, less than or equal to about 45 nm, less than or equal to about 40 nm, less than or equal to about 35 nm, less than or equal to about 30 nm, or less than or equal to about 28 nm, within the above range, about 3 nm to about 50 nm, about 3 nm to about 45 nm, about 3 nm to about 40 nm, about 3 nm to about 35 nm, about 3 nm to about 30 nm, or about 3 nm to about 28 nm. As described above, the quantum dot may implement good color purity and color reproducibility by having a relatively narrow full width at half maximum.

The quantum dot may be commercially available or may be synthesized by any method. For example, it may be synthesized by a wet chemical process, metal organic chemical vapor deposition ("MOCVD"), molecular beam epitaxy ("MBE"), or a similar process thereto. In an embodiment, the quantum dots may be colloidal particles synthesized through a wet chemical process. In the wet chemical process, crystal particles are grown by reacting precursor materials in an organic solvent, and in this case, the organic solvent or ligand compound may be coordinated to the surface of the quantum dot, thereby controlling a growth of the crystal. Specific types of organic solvents and ligand compounds are known. The colloidal quantum dots synthesized in the wet chemical process may be recovered by adding a non-solvent to the reaction solution and centrifuging the final mixture. This recovery process may result in the removal of at least a portion of the organic matter coordinated to the surface of the quantum dot. Examples of non-solvents include, but are not limited to, acetone, ethanol, methanol, and the like.

For example, the quantum dot may include a Group II-VI semiconductor compound, a Group III-V semiconductor compound, a Group III-VI semiconductor compound, a Group IV-VI semiconductor compound, a Group IV element or semiconductor compound, a Group I-III-VI semiconductor compound, a Group I-II-IV-VI semiconductor compound, a Group II-III-V semiconductor compound, or a combination thereof.

The Group II-VI semiconductor compound may include, for example, a binary semiconductor compound selected from CdS, CdSe, CdTe, ZnS, ZnSe, ZnTe, ZnO, HgS, HgSe, HgTe, MgSe, MgS, and a mixture thereof; a ternary semiconductor compound selected from CdSeS, CdSeTe, CdSTe, ZnSeS, ZnSeTe, ZnSTe, HgSeS, HgSeTe, HgSTe, HgZnS, HgZnSe, HgZnTe, MgZnSe, MgZnS, CdZnS, CdZnSe, CdZnTe, CdHgSe, CdHgSe, CdHgSe, CdHgSe, CdHgSe, CdHgSe, HgZnTe, MgZnSe, MgZnS, CdZnSe, CdZnTe, and a mixture thereof; a quaternary semiconductor compound selected from CdZnSeS, CdZnSeTe, CdZnSTe, CdHgSeS, CdHgSeTe, CdHgSTe, HgZnTeS, HgZnSeS, HgZnSeTe, HgZnSTe, and a mixture thereof; or a combination thereof, but is not limited thereto.

The Group III-V semiconductor compound may include, for example, a binary semiconductor compound selected from GaN, GaP, GaAs, GaSb, AlN, AlP, AlAs, AlSb, InN, InP, InAs, InSb, and a mixture thereof; a ternary semiconductor compound selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and a mixture thereof; and a quaternary semiconductor compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; a combination thereof, but is not limited thereto. The Group III-V semiconductor compound may further include a Group II element. The Group III-V semiconductor compound further including a Group II element may include, for example, InZnP, InGaZnP, InAlZnP, or a combination thereof.

The Group III-VI semiconductor compound may include, for example, a binary semiconductor compound selected from GaS, GaSe, $Ga_2Se_3$, GaTe, InS, InSe, $In_2Se_3$, InTe, and a mixture thereof; a ternary semiconductor compound selected from $InGaS_3$, $InGaSe_3$, and a mixture thereof; or a combination thereof.

The Group IV-VI semiconductor compound may include, for example, a binary semiconductor compound selected from SnS, SnSe, SnTe, PbS, PbSe, PbTe, and a mixture thereof; a ternary semiconductor compound selected from SnSeS, SnSeTe, SnSTe, PbSeS, PbSeTe, PbSTe, SnPbS, SnPbSe, SnPbTe, and a mixture thereof; a quaternary semiconductor compound selected from SnPbSSe, SnPbSeTe, SnPbSTe, and a mixture thereof; or a combination thereof, but is not limited thereto.

The Group IV element or semiconductor compound may include, for example, a single element semiconductor compound selected from Si, Ge, and a mixture thereof; a binary semiconductor compound selected from SiC, SiGe, and a mixture thereof; or a combination thereof, but is not limited thereto.

The Group I-III-VI semiconductor compound may be, for example, $AgInS$, $AgInS_2$, $CuInS$, $CuInS_2$, $CuInSe_2$, $CuInGaSe$, $CuInGaS$, $CuGaO_2$, $AgGaO_2$, $AgAlO_2$, or a mixture thereof, but is not limited thereto.

The Group I-II-IV-VI semiconductor compound may be, for example, $CuZnSnSe$, $CuZnSnS$, or a combination thereof, but is not limited thereto.

The Group II-III-V semiconductor compound may include, for example, InZnP, but is not limited thereto.

The quantum dot may include a binary semiconductor compound, a ternary semiconductor compound, or a quaternary semiconductor compound in a substantially uniform concentration, or may include it in a state in which the concentration distribution is partially different.

For example, the quantum dot may be a semiconductor compound including indium (In), zinc (Zn), and at least one of phosphorus (P), for example, an In—P semiconductor compound, and/or an In—Zn—P semiconductor compound. For example, the quantum dot may be a semiconductor compound including zinc (Zn), and any one of tellurium (Te) and selenium (Se), for example, a Zn—Te semiconductor compound, a Zn—Se semiconductor compound, and/or a Zn—Te—Se semiconductor compound.

The quantum dot may have a single structure in which the concentration of each element included in the quantum dot is uniform, or may have a core-shell structure. The shell of the quantum dot may be, for example, a protective layer for preventing chemical modification of the quantum dot core, or a charging layer for imparting electrophoretic properties to the quantum dot.

The shell of the quantum dot may include, for example, a metal or non-metal oxide, a semiconductor compound, or a combination thereof. Examples of metal or non-metal oxides may include a diatomic compound selected from $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and a mixture thereof; a ternary compound selected from $MgAl_2O_4$, $CoFe_2O_4$, $NiFe_2O_4$, $CoMn_2O_4$, and a mixture thereof; or a combination thereof. Examples of the semiconductor compound may include the aforementioned Group II-VI semiconductor compound, Group III-V semiconductor compound, Group III-VI semiconductor compound, Group IV-Group VI semiconductor compound, Group IV element or semiconductor compound, Group I-III-VI semiconductor compound, Group I-II-IV-VI semiconductor compound, Group II-III-V semiconductor compound, or a combination thereof, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

For example, the interface between the core and the shell of the quantum dot may have a concentration gradient in which a concentration of the element in the shell decreases toward the center. For example, the material composition constituting the shell of the quantum dot may have a higher energy bandgap than the material composition constituting the core of the quantum dot, which allows the quantum dot a quantum confinement effect. The quantum dot may include one quantum dot core and a multi-layered quantum dot shell surrounding the core. In this case, the multi-layered shell may have two or more layers, and each layer may independently have a single composition, an alloy, and/or concentration gradient. For example, among the multi-layered shells, a shell farther from the core may have a higher energy bandgap than a shell closer to the core, which also allows the quantum dot a quantum confinement effect.

For example, the quantum dot may include a cadmium-free quantum dot (Cd-free quantum dot). The cadmium-free quantum dot is a quantum dot that does not contain cadmium (Cd). Since cadmium (Cd) may cause serious environmental/health problems and is a regulated element under the Restriction of Hazardous Substances (RoHS) in many countries, the quantum dot may be effectively used.

The quantum dot may have an organic ligand bound to its surface. The organic ligand may have a hydrophobic moiety. The organic ligand may include $RCOOH$, $RNH_2$, $R_2NH$, $R_3N$, $RSH$, $R_3PO$, $R_3P$, $ROH$, $RCOOR'$, $RPO(OH)_2$, $R_2POOH$ (where, R and R' are independently hydrogen, a C1 to C30 substituted or unsubstituted aliphatic hydrocarbon group, for example a C1 to C30 alkyl group, a C2 to C30 alkenyl group, or a C6 to C30 aromatic hydrocarbon group, for example a C6 to C20 aryl group, provided that at least one is not hydrogen), or a combination thereof.

Specific examples of the organic ligand may include thiol compounds such as methane thiol, ethane thiol, propane thiol, butane thiol, pentane thiol, hexane thiol, octane thiol, dodecane thiol, hexadecane thiol, octadecane thiol, benzyl thiol, and the like; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; phosphine compounds such as methyl phosphine, ethyl phosphine, propyl phosphine, butyl phosphine, pentyl phosphine, octylphosphine, dioctyl phosphine, tributylphosphine, trioctylphosphine, and the like; phosphine compounds or oxide compounds thereof such as methyl phosphine oxide, ethyl phosphine oxide, propyl phosphine oxide, butyl phosphine oxide pentyl phosphineoxide, tributylphosphineoxide, octylphosphine oxide, dioctyl phosphineoxide, and trioctylphosphineoxide; diphenyl phosphine, triphenyl phosphine compounds or oxide compounds thereof; C5 to C20 (mono- or di) alkylphosphinic acid such as (mono- or di) hexylphosphinic acid, (mono- or di) octylphosphinic acid, (mono- or di) dodecanephosphinic acid, (mono- or di) tetradecanephosphinic acid, (mono- or di) hexadecanephosphinic acid, and (mono- or di) octadecanephosphinic acid, C5 to C20 alkyl phosphonic acid such as hexylphosphonic acid, octylphosphonic acid, dodecanephosphonic acid, tetradecanephosphonic acid, hexadecanephosphonic acid, and octadecanephosphonic acid, but are not limited thereto. The organic ligand may be used alone or as a mixture of two or more.

Each of the color conversion layers 30R, 30G, and 30B may further include a phosphor in addition to quantum dots. Examples of the red phosphor may include (Ca, Sr, Ba)S, (Ca, Sr, Ba)$_2$Si$_5$N$_8$, CaAlSiN$_3$, CaMoO$_4$, or Eu$_2$Si$_5$N$_8$, and examples of the green phosphor may include yttrium aluminum garnet (YAG), (Ca, Sr, Ba)$_2$SiO$_4$, SrGa$_2$S$_4$, barium magnesium aluminate ("BAM"), alpha sialon ($\alpha$-SiAlON), beta sialon ($\beta$-SiAlON), Ca$_3$Sc$_2$Si$_3$O$_{12}$, Tb$_3$Al$_5$O$_{12}$, BaSiO$_4$, CaAlSiON, or (Sr$_{1-x}$Ba$_x$)Si$_2$O$_2$N$_2$, but are not limited thereto. The x may be any number between 0 and 1.

Each of the color conversion layers 30R, 30G, and 30B may emit light of a wavelength spectrum of a color displayed by each of the subpixels PX1, PX2, and PX3, and accordingly, the quantum dots included in each of the color conversion layers 30R, 30G, and 30B may be different from each other.

For example, the quantum dots included in the color conversion layer 30R may convert the light emitted from the light emitting element 20a into light having a first emission spectrum that is the same as the wavelength spectrum of the color displayed in the first subpixel PX$_1$. The first emission spectrum may be different from the emission spectrum of the light emitted from the light emitting element 20a, and may be a longer wavelength spectrum. Accordingly, the display panel according to an embodiment may include a first color conversion layer 30R including quantum dots that convert an emission spectrum of light emitted from the light emitting element 20a among a plurality of color conversion layers into light having the first emission spectrum.

In addition, for example, the quantum dots included in the color conversion layer 30G may convert the light emitted from the light emitting element 20b into light having a second emission spectrum that is the same as the wavelength spectrum of the color displayed in the second subpixel PX$_2$. The second emission spectrum may be different from the first emission spectrum and the emission spectrum of the light emitted from the light emitting element 20b, and may be a longer wavelength spectrum than these emission spectra. Accordingly, the display panel according to an embodiment may include a second color conversion layer 30G including quantum dots that convert an emission spectrum of light emitted from the light emitting element 20b among a plurality of color conversion layers into light of a second emission spectrum.

For example, each of the plurality of the light emitting elements 20a, 20b, and 20c may emit light having a blue light emission spectrum, and when the first subpixel PX$_1$, second subpixel PX$_2$, and third subpixel PX$_3$ display red, green, and blue colors, respectively, the first color conversion layer 30R of the first subpixel PX$_1$ may include quantum dots that convert light of a blue light emission spectrum into light of a red light emission spectrum, and the second color conversion layer 30G of the second subpixel PX$_2$ may include quantum dots that convert light of a blue light emission spectrum into light of a green light emission spectrum. Since the blue color displayed in the third subpixel PX$_3$ may be displayed by the light of the blue light emission spectrum emitted from the light emitting element 20c, the third color conversion layer 30B of the third subpixel PX$_3$ may not include a color converter, that is, for example, quantum dots, and thus, the third color conversion layer 30B may also be referred to as a transmission layer. In another embodiment, the third color conversion layer 30B may further include a color converter such as quantum dots for emitting light of a blue light emission spectrum, or a pigment or dye. The third color conversion layer 30B including a dye or a pigment may reduce external light reflection and provide blue light with improved color purity.

At least one of each of the color conversion layers 30R, 30G, and 30B may further include a scatterer (not shown). When each of the color conversion layers 30R, 30G, and 30B includes a scatterer, a content of the scatterer may be different. The scatterer may scatter and/or reflect light in multiple directions irrespective of the angle of incidence without substantially changing the wavelength of light emitted from the quantum dots and/or light emitting elements 20a, 20b, and 20c, and thus the amount of light that is converted or passed through the color conversion layers 30R, 30G, and 30B may increase, and front luminance and side luminance may be uniformly provided.

The scatterer may be a low refractive index nanoparticle, for example, a metal or a semi-metal oxide such as silicon oxide, titanium oxide, zirconium oxide, aluminum oxide, indium oxide, zinc oxide, tin oxide, or a combination thereof; an organic material such as an acrylic resin, a urethane resin, or a combination thereof; or a combination thereof, but is not limited thereto.

In an embodiment, the color conversion layers 30R, 30G, and 30B may include a color converter (e.g., quantum dot) dispersed in a polymer matrix. The polymer matrix may include a light transmitting resin. The light transmitting resin may be a dispersion medium for dispersing quantum dots and/or scattering particles, for example, an acrylic resin, a urethane resin, a silicone resin, an epoxy resin, a cardo-based resin, an imide resin, a derivative thereof, or a combination thereof, but is not limited thereto. The light transmitting resin may be prepared from a photosensitive resin composition including a photopolymerizable monomer, a polymer including a photosensitive functional group, or a combination thereof. The photosensitive resin composition may further include a photoinitiator that helps the photopolymerizable monomer, polymer, or a combination thereof to undergo a polymerization reaction by exposure to light. In addition, the photosensitive resin composition may further include a solvent.

The micro lens 40 is formed in a shape to completely surround the color conversion layers 30R, 30G, and 30B on the color conversion layers 30R, 30G, and 30B, respectively, to adjust a divergence angle of light emitted from the color conversion layers 30R, 30G, and 30B, so that the emitted light may be emitted toward the front of the display panel 100. Accordingly, in the display panel according to the embodiment, light efficiency may be increased and color purity may be increased by preventing color mixing with light emitted from adjacent color conversion layers that emit light of different emission spectra.

In the display panel according to the embodiment, the micro lens 40 may be made of a transparent material that can transmit light without absorbing light emitted from the light emitting elements 20a, 20b, and 20c or the color conversion layers 30R, 30G, and 30B, and may include, for example, a resin that is the same as the resin included in the color conversion layers 30R, 30G, and 30B. In an embodiment, the micro lens 40 may include polyimide, epoxy resin ("SU-8"), spin-on-glass ("SOG"), poly methylmethacrylate ("PMMA"), poly dimethylsioxane ("PDMS"), poly carbonate ("PC"), silicone gel, or a silicone resin, and a low refractive index may be desirable. It is desirable that the micro lens has insulation, but it may also be considered to have conductivity.

The material forming the micro lens 40 may also be prepared from a photosensitive resin composition, which includes a photopolymerizable monomer for preparing the resin, a polymer, or a combination thereof, and may also further include a photoinitiator for initiating photopolymerization when these materials are exposed and/or a solvent.

As described above, the display panel according to an embodiment includes a plurality of micro lenses 40 formed in a convex lens shape to completely surround the light emitting elements 20a, 20b, and 20c, so that a divergence angle of the light emitted from the color conversion layer 30R, 30G, and 30B may be easily adjusted to face the front of the display panel 100. Accordingly, the display panel 100 according to an embodiment may prevent color mixing of light emitted from an adjacent color conversion layer. Accordingly, the display panel according to the embodiment may not include the partition walls anywhere between adjacent light emitting elements, adjacent color conversion layers, or adjacent micro lenses.

Hereinafter, the display panel according to FIG. 3 is described.

Referring to FIG. 3, a display panel 200 according to another embodiment includes a substrate 10, light emitting elements 20a, 20b, and 20c on the substrate 10, micro lenses 40 formed to completely surround the light emitting elements 20a, 20b, and 20c, and color conversion layers 30R, 30G, and 30B formed to completely surround the micro lenses 40 on micro lenses 40.

Comparing the display panel 200 shown in FIG. 3 with the display panel 100 according to FIG. 2, the positions of the color conversion layers 30R, 30G, and 30B and the micro lenses 40 disposed on the light emitting elements 20a, 20b, and 20c are exchanged with each other, and the rest of the configurations are all the same. That is, although the display panel 200 of FIG. 3 is different from the display panel 100 of FIG. 2 in that the micro lenses 40 are first disposed on the light emitting elements 20a, 20b, and 20c, and the color conversion layers 30R, 30G, and 30B are formed thereon, and on a plurality of light emitting elements 20a, 20b, and 20c arranged on one substrate 10, the micro lenses 40 and the color conversion layers 30R, 30G, and 30B are formed so that light emitting elements 20a, 20b, and 20c are completely surrounded, and the vertical positions of micro lenses 40 and the color conversion layers 30R, 30G, and 30B are changed, they are the same in that they are formed in the shapes corresponding to each other.

Herein, "corresponding to each other" means that the shapes of portions in which each of the color conversion layers 30R, 30G, and 30B and the micro lenses 40 are in contact with each other are substantially the same. In another embodiment to be described later, when an absorption-type color filter layers are additionally included on the micro lenses 40 or the color conversion layers 30R, 30G, and 30B, the absorption-type color filter layers may also have a shape corresponding to the micro lenses 40 or color conversion layers 30R, 30G, and 30B. When the absorption-type color filter layers are present between the micro lenses 40 and the color conversion layers 30R, 30G, and 30B, the shapes of the portions in which the absorption-type color filter layers and the micro lenses 40 or the absorption-type color filter layers and the color conversion layers 30R, 30G, and 30B are in contact with may be substantially the same as each other, and the micro lenses 40 and the color conversion layers 30R, 30G, and 30B that do not directly contact with each other with the absorption-type color filter layers disposed therebetween may also have substantially the same shapes of the interfaces in contact with the absorption-type color filter layer.

In the case of the display panel 200 of FIG. 3, as the micro lenses 40 are first formed on the light emitting elements 20a, 20b, and 20c, respectively, and the color conversion layers 30R, 30G, and 30B are formed thereon, the light emitted from each of the light emitting elements 20a, 20b, and 20c passes through corresponding micro lens 40 to adjust the divergence angle to face the front. Accordingly, the divergence angle of the light incident to each of the color conversion layers 30R, 30G, and 30B is also adjusted to face the front of the display panel 200, and the light efficiency toward the front of the display panel 200 may be improved. In addition, in this case, the micro lenses 40 may have an effect of more stably maintaining the color conversion layers 30R, 30G, and 30B compared with the display panel 100 of FIG. 2 in which the color conversion layers 30R, 30G, 30B including quantum dots are directly disposed on the light emitting elements 20a, 20b, and 20c.

Except for the above, descriptions of substrate 10, light emitting elements 20a, 20b, and 20c, micro lenses 40, and color conversion layers 30R, 30G, and 30B are the same as the descriptions with respect to display panel 100 according to FIG. 2, detailed descriptions of each are omitted.

Meanwhile, although not shown in FIGS. 2 and 3, both display panel 100 of FIG. 2 and display panel 200 of FIG. 3 may further include absorption-type color filter layer on the micro lenses 40 or the color conversion layers 30R, 30G, and 30B. The display panels 1000, 100, and 200 according to embodiments may further include an absorption-type color filter layers on the micro lenses 40 or the color conversion layers 30R, 30G, and 30B, so that color purity of light emitted from the color conversion layers 30R, 30G, and 30B may be further increased.

The absorption-type color filter layer may include a pigment or dye dispersed in a polymer matrix, wherein the polymer matrix is the same light transmitting resin as the light transmitting resin included in the color conversion layers 30R, 30G, and 30B and/or the micro lenses 40. That is, the absorption-type color filter layer may also be prepared from the photosensitive resin composition. The photosensitive resin composition may include a photopolymerizable monomer, a polymer, or a combination thereof, a photoinitiator, and/or a solvent which are similar to the photosensitive resin composition for producing the color conversion layer 30R, 30G, and 30B or the micro lens 40. Pigments and dyes included in the absorption-type color filter layer may be known pigments and dyes.

In the display panel 100 of FIG. 2, absorption-type color filter layers (not shown) may be disposed on the micro lenses 40, or each of the absorption-type color filter layers may be disposed between each of the micro lenses 40 and each of the color conversion layers 30R, 30G, and 30B in the shape corresponding to all of them.

In the display panel 200 of FIG. 3, absorption-type color filter layers (not shown) may be disposed on the color conversion layers 30R, 30G, and 30B, respectively.

Figure 4:
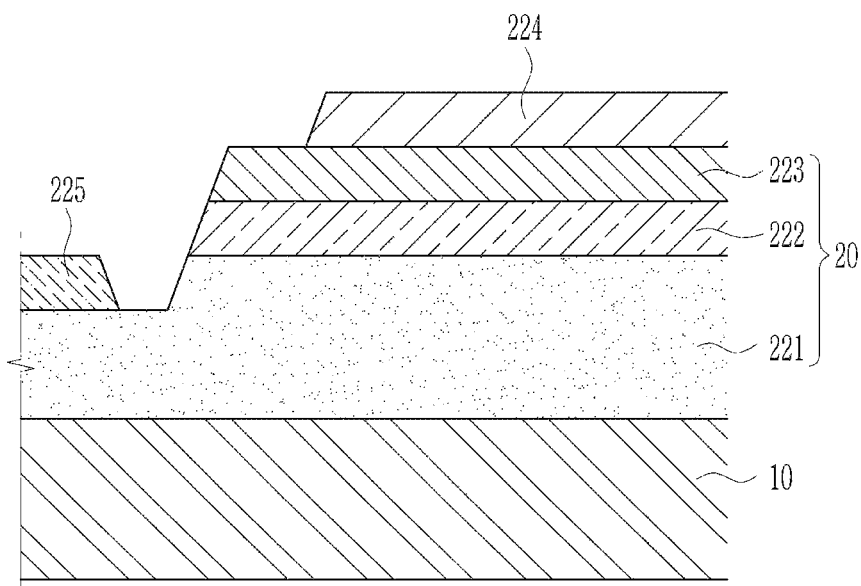
FIG. 4 is a schematic cross-sectional view of some components of a display panel according to an embodiment.

Hereinafter, the light emitting element 20 included in the display panel according to an embodiment will be described with reference to FIG. 4. FIG. 4 is a schematic cross-sectional view of a partial region of the light emitting element 20 according to an embodiment.

In FIG. 4, the light emitting element 20 on the substrate 10 may include a first conductivity-type semiconductor layer 221, an active layer 222 on a first conductivity-type semiconductor layer 221, and a second conductivity-type semiconductor layer 223 on the active layer 222.

The first conductivity-type semiconductor layer 221 may be an n-type semiconductor layer, and the second conductivity-type semiconductor layer 223 may be a p-type semiconductor layer. In addition, the first conductivity-type semiconductor layer 221 and the second conductivity-type semiconductor layer 223 may include a nitride semiconductor. The first conductivity-type semiconductor layer 221 and the second conductivity-type semiconductor layer 223 may have an $Al_xIn_yGa_{(1-x-y)}N$ composition formula (where $0 \leq x \leq 1$, $0 \leq y \leq 1$, $0 \leq x$ $y \leq 1$). The first conductivity-type semiconductor layer 221 and the second conductivity-type semiconductor layer 223 may include at least one material selected from GaN, AlGaN, and InGaN. In an embodiment, the first conductivity-type semiconductor layer 221 may include an n-type doped nitride semiconductor material, and the second conductivity-type semiconductor layer 223 may include a p-type doped nitride semiconductor material. For example, the first conductivity-type semiconductor layer 221 may include GaN doped with n-type, and the second conductivity-type semiconductor layer 223 may include GaN doped with p-type.

The active layer 222 emits light having a predetermined energy by recombination of electrons and holes, and may have a multi-quantum well ("MQW") structure in which quantum well layers and quantum barrier layers are alternately stacked. In the case of a multi-quantum well structure, it may have an InGaN/GaN structure. The first conductivity-type semiconductor layer 221, the active layer 222, and the second conductivity-type semiconductor layer 223 may be epitaxial layers.

In some embodiments, the light emitting element 20 may be formed by metal-organic chemical vapor deposition (MOCVD), hydride vapor phase epitaxy ("HVPE"), or molecular beam epitaxy (MBE) process.

Although not shown, a nitride semiconductor thin film may be disposed between the substrate 10 and the light emitting element 20. The nitride semiconductor thin film may serve as a buffer layer for alleviating a lattice mismatch between the substrate 10 and the first conductivity-type semiconductor layer 221.

The first conductivity-type semiconductor layer 221 may be connected to the first electrode 225, and the second conductivity-type semiconductor layer 223 may be connected to the second electrode 224. The first electrode 225 and the second electrode 224 are separated from each other and do not contact each other.

The first electrode 225 and the second electrode 224 may be formed of a metal or an alloy having high reflectivity in a wavelength region of light emitted from the light emitting element 20. Each of the first electrode 225 and the second electrode 224 may include a single film made of a single material selected from Au, Sn, Ni, Pb, Ag, In, Cr, Ge, Si, Ti, W, and Pt or an alloy containing at least two materials selected therefrom or a multi-film formed of a combination thereof.

As described above, the display panel according to an embodiment includes a plurality of the color conversion layers 30R, 30G, and 30B and a plurality of the micro lenses 40 having each corresponding shape each other to completely surround each of the light emitting elements 20a, 20b, and 20c, on the light emitting elements 20a, 20b, and 20c aligned on the substrate 10. In an embodiment, the color conversion layers 30R, 30G, and 30B and the micro lenses 40 may be formed of each photosensitive resin composition. In a conventional display, a photosensitive resin composition is used to manufacture a color conversion layer, micro lens, or the like. However, the conventional display panel is manufactured by separately preparing the color conversion layer and the micro lenses as a separate panel or array, and adhering these panels and/or arrays to each other by using an optical clear adhesive ("OCA") film. This method uses exposing the photosensitive resin composition to an external light source placed on top of the corresponding panel or array to manufacture each panel or array. The display panel according to an embodiment has a common with the conventional display panel in using the photosensitive resin composition to form the color conversion layers 30R, 30G, and 30B and the micro lenses 40. However, the display panel according to an embodiment can be prepared by using lower light emitted from the light emitting elements 20a, 20b, and 20c of the display panel without using the external light source to form the color conversion layers 30R, 30G, and 30B and the micro lenses 40. The display panel according to an embodiment, which is manufactured by adopting this method, may not be easily manufactured by a conventional lithographic method using an external upper light source, and thus, completely new and different from the conventional display panel.

As described above, after manufacturing the conventional display panel by separately manufacturing at least two panels of a light emitting panel including a light emitting element and a color conversion panel including a color conversion layer, and bonding them with the optical clear adhesive (OCA) film, when micro lenses are additionally formed thereon to adjust a divergence angle or the like, a micro lens array also should be separately manufactured, and adhered again onto the display panel by using the optical clear adhesive (OCA) film. The display panel manufactured in this way requires a complicated work process and takes a lot of work time due to the additional high-precision bonding process using the adhesive film after manufacturing each panel in addition to time required to manufacture each panel, thereby increasing a manufacturing cost. In addition, the display panel manufactured as described above has another problem that an adhesive layer is cracked or delaminated due to thermal deformation as a display is driven. In addition, since more members should be used, the display panel becomes heavier and more expensive, and also has light loss while light emitted from the light emitting element or passing the color conversion layer should pass the adhesive layer. Furthermore, the aforementioned method may have more limitations in application, as the display panel has a larger area. In addition, when smaller pixels are included in order to realize higher resolution, a partition wall should be necessarily formed to prevent color mixing between the color conversion layers. This partition wall may require a complicated lithography process, which should be several times repetitively conducted to form the color conversion layers that emit different colors of light for each pixel between the partition walls. Furthermore, the bonding the color conversion panel and the light emitting panel requires high-precision bonding to match alignment of each pixel, in which an alignment key, etc. may be installed.

The display panel according to an embodiment may solve all the problems of the conventional art. As described above, the display panel according to an embodiment is not manufactured by separately manufacturing the light emitting panel and the color conversion panel and bonding them, but by directly forming the color conversion layers 30R, 30G, and 30B and the micro lenses 40 on a plurality of light emitting elements 20a, 20b, and 20c arranged on only one substrate, and thus, includes neither separate color conversion panel nor separate micro lens array. Furthermore, the display panels 1000, 100, and 200 according to an embodiment include a plurality of the micro lenses 40 completely surrounding each light emitting element 20a, 20b, and 20c and formed in convex lenses, and thus may easily adjust a divergence angle of light emitted from the color conversion layers 30R, 30G, and 30B toward the front of the display panel 100. Accordingly, the display panel 100 according to an embodiment may prevent color mixing with light emitted from the adjacent color conversion layers 30R, 30G, and 30B, and thus include no partition wall between the adjacent light emitting elements, the adjacent color conversion layers, or the adjacent micro lens. As the partition wall is omitted, the complicated lithography process for forming the partition wall may also be omitted, and the divergence angle is adjusted, improving light efficiency.

The aforementioned display panel according to an embodiment does not use the conventional lithography method using upper light to manufacture color conversion layer or micro lens arrays. The display panel according to an embodiment may be manufactured by exposing photosensitive resin compositions for forming the color conversion layers 30R, 30G, and 30B and the micro lenses 40 to light emitted from each of the plurality of the light emitting elements 20a, 20b, and 20c and curing them so that a plurality of the color conversion layers 30R, 30G, and 30B and the micro lenses 40 may be formed to surround a plurality of the light emitting elements 20a, 20b, and 20c.

Specifically, the aforementioned display panel may be manufactured by preparing a substrate, for example, transparent substrate 10, on which a plurality of the light emitting elements 20a, 20b, and 20c are arranged, applying a photosensitive resin composition for forming color conversion layers 30R, 30G, and 30B or micro lenses 40 on the substrate 10, driving a portion or all of the light emitting elements 20a, 20b, and 20c to emit light and thus expose the photosensitive resin composition to the light, and curing it to form the color conversion layers 30R, 30G, and 30B and/or the micro lenses 40 on light emitting elements 20a, 20b, and 20c, respectively. Since the photosensitive resin composition is exposed to light and cured only around a specific light emitting element by driving the light emitting element, the rest of the photosensitive resin composition not exposed and cured around the undriven light emitting elements may easily be developed with a developing solution and removed. Accordingly, a specific color conversion layer emitting light of the specific emission spectrum may be selectively formed in a specific region, for example, a specific subpixel region.

The photosensitive resin composition for forming a color conversion layer may include a color converter, for example, a quantum dot, for example, an ink composition including quantum dots or a photosensitive resin composition including quantum dots. The ink composition or the photosensitive resin composition may include a photopolymerizable monomer including a functional group polymerized by light emitted from the light emitting element, a polymer, or a combination thereof, and may further include a photoinitiator and/or a solvent for the polymerization. In addition, an ink composition or photosensitive resin composition for forming each of the color conversion layers 30R, 30G, and 30B may include different quantum dots according to an emission spectrum of light emitted by each subpixel.

The photopolymerizable monomer or polymer included in the ink composition or photosensitive resin composition that includes quantum dots may include various photopolymerizable monomers or polymers without a particular limitation but be appropriately selected from monomers and/or polymers that may be well mixed with the quantum dots.

A photosensitive resin composition for forming the micro lens may be the same or similar photosensitive resin composition to the photosensitive resin composition for forming the color conversion layer except that the color converter such as quantum dots is not included.

Hereinafter, referring to FIGS. 5 to 8, a method of manufacturing the display panel according to an embodiment as shown in FIG. 2 will be described.

Figure 5:
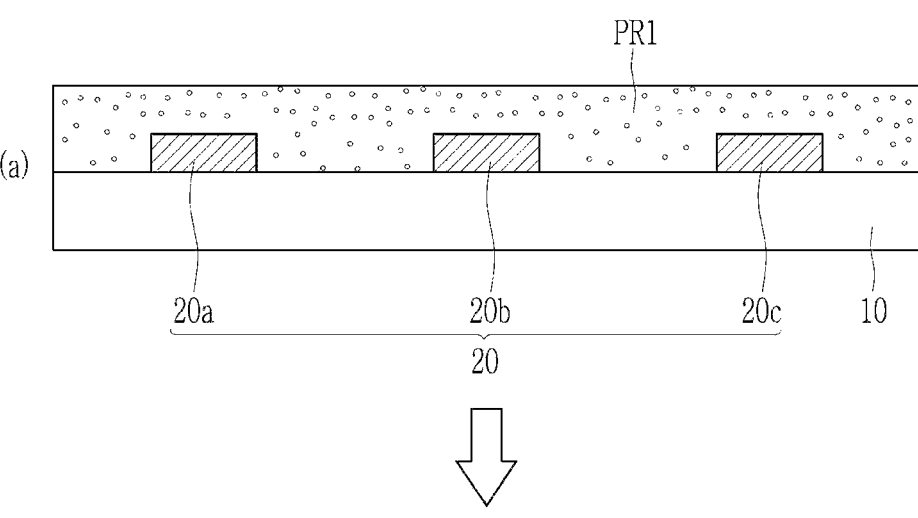
Figure 5:
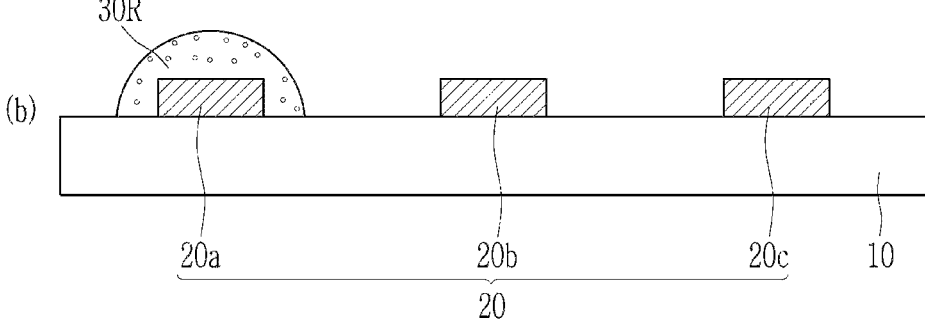

Firstly, referring to (a) of FIG. 5, after applying a photosensitive resin composition PR1 for forming the color conversion layer 30R including quantum dots converting light emitted from the light emitting element 20a to light emitted from the first subpixel PX$_1$ on the substrate 10 on which a plurality of the light emitting elements 20a, 20b, and 20c are arranged, the light emitting element 20a in the first subpixel PX$_1$ among the plurality of the light emitting elements 20a, 20b, and 20c is driven to emit light. Accordingly, since only a portion of the photosensitive resin PR1 applied on the substrate 10 that is exposed to the light emitted from the light emitting element 20a is photopolymerized and cured, as the substrate 10 is developed with a developing solution after the exposure, the color conversion layer 30R is disposed only around the light emitting element 20a, while the other portion of the photosensitive resin composition PR1 may be removed (refer to (b) of FIG. 5).

Figure 6:
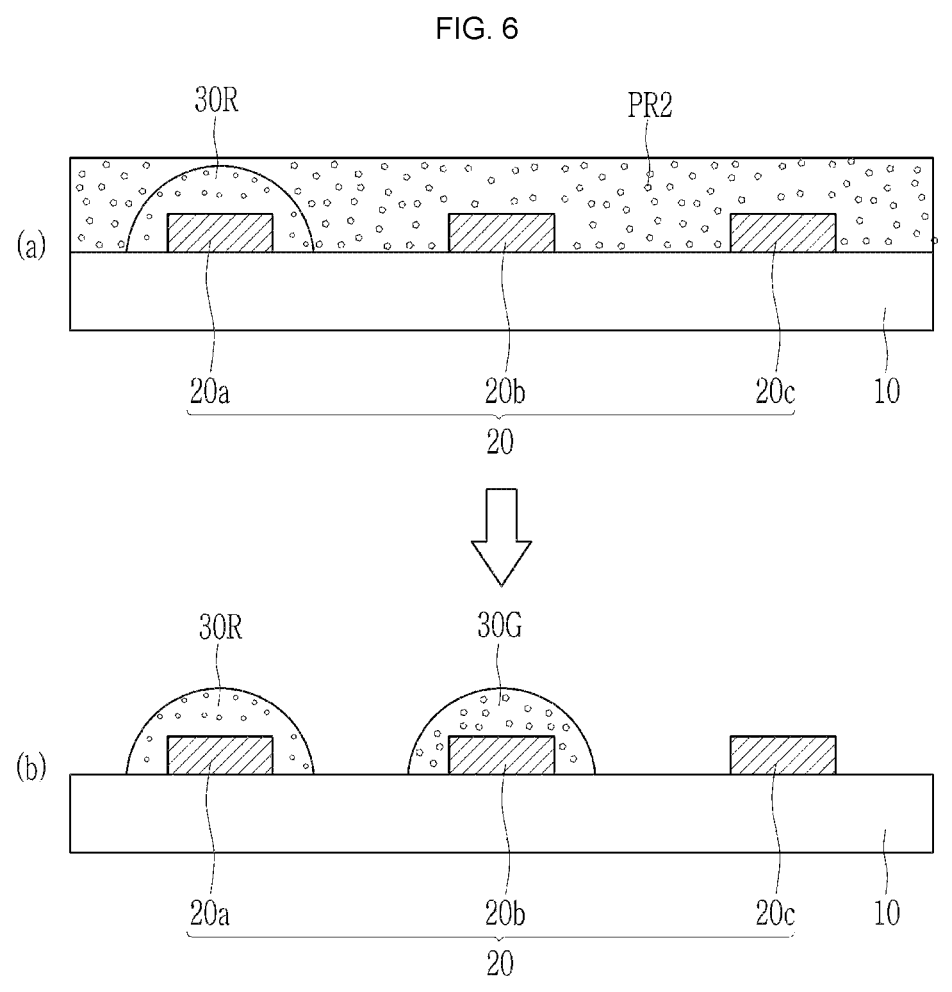

Subsequently, as shown in (a) of FIG. 6, on the entire substrate 10 on which the color conversion layer 30R is formed, after applying the photosensitive resin composition PR2 for forming the color conversion layer 30G including quantum dots that convert light emitted from the emitting element 20b to light emitted from the second subpixel PX$_2$, the light emitting element 20b alone among the plurality of the light emitting elements 20a, 20b, and 20c is driven to emit light. Accordingly, since only a portion of the photosensitive resin PR2 applied to the substrate 10 that is exposed to the light from the light emitting element 20b is polymerized and cured, as the substrate 10 is developed with a developing solution after the exposure, the color conversion layer 30G may be additionally formed around the light emitting element 20b (refer to (b) of FIG. 6).

Figure 7:
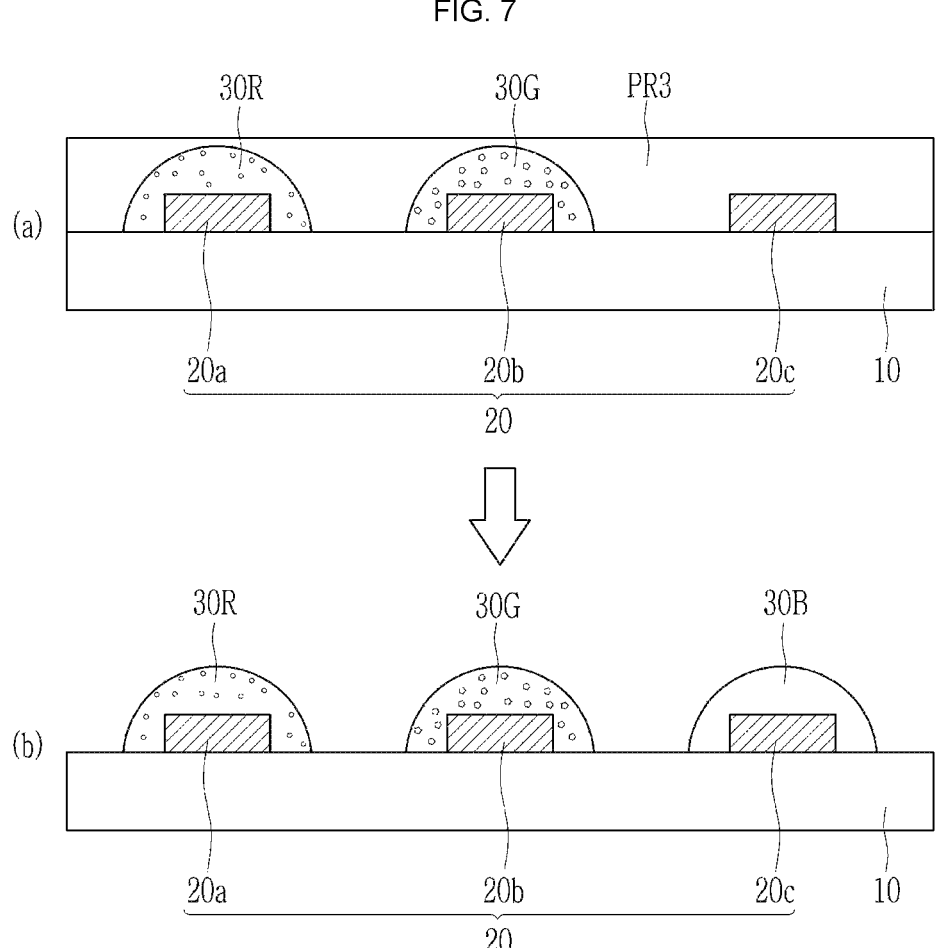

Subsequently, as shown in (a) of FIG. 7, after applying a photosensitive resin composition PR3 including no quantum dots to form a transmission layer 30B for transmitting light emitted from the light emitting element 20c on the entire substrate 10 on which the color conversion layers 30R and 30G are formed, the light emitting element 20c among the plurality of the light emitting elements 20a, 20b, and 20c is driven to emit light. Accordingly, since only a portion of the photosensitive resin PR3 applied to the substrate 10 that is exposed to the light emitted from the light emitting element 20c is photopolymerized and cured, as the substrate 10 is developed with a developing solution after the exposure, the transmission layer 30B around the light emitting element 20c may be additionally formed (refer to (b) of FIG. 7).

Figure 8:
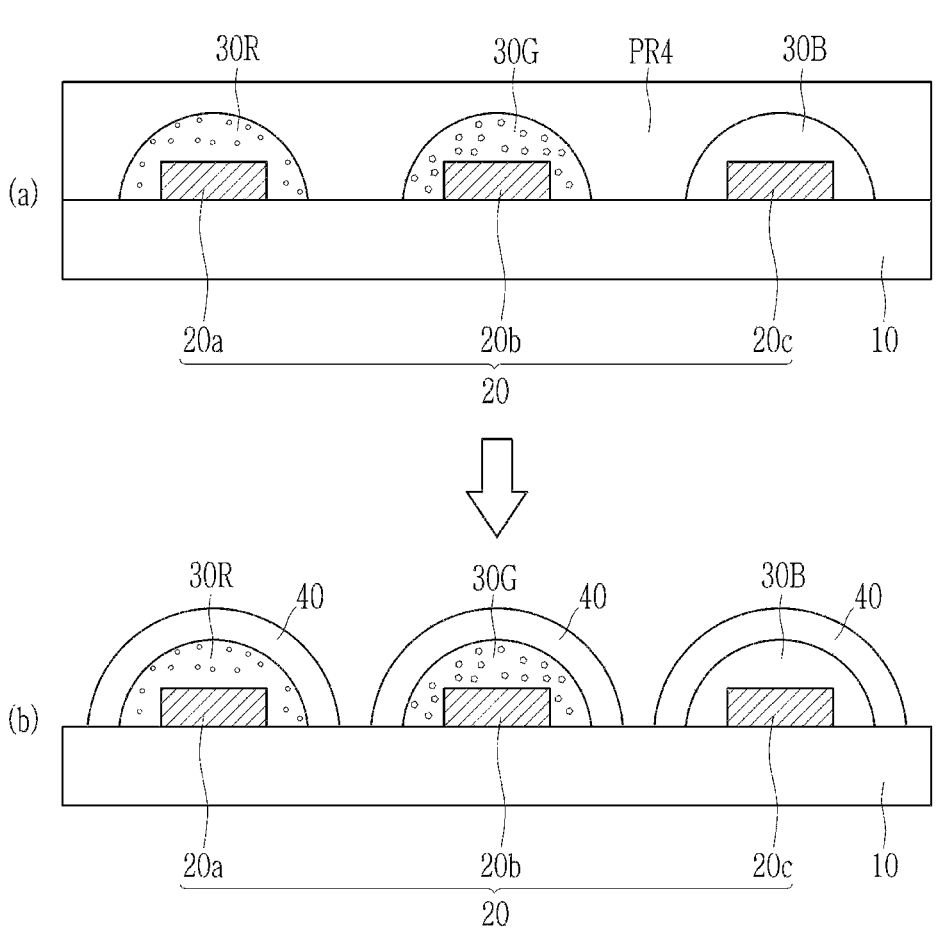

Lastly, referring to (a) of FIG. 8, on the entire substrate 10 on which the color conversion layers 30R, 30G, and 30B are all formed, after applying a photosensitive resin composition PR4 for forming the micro lenses 40 on the color conversion layers 30R, 30G, and 30B, respectively, all the plurality of the light emitting elements 20a, 20b, and 20c are driven to emit light. Accordingly, only a region of the photosensitive resin PR4 applied to the substrate 10 that is exposed to leakage light passing each color conversion layer 30R, 30G, and 30B out of the light emitted from each of the light emitting elements 20a, 20b, and 20c is polymerized and cured. Subsequently, as the substrate 10 is developed with a developing solution, each of the micro lenses 40 may be formed to completely surround each of the color conversion layers 30R, 30G, and 30B, around each of the color conversion layers 30R, 30G, and 30B ((b) of FIG. 8). This display panel may be the same display panel as shown in FIG. 2.

The display panel manufactured as described above is manufactured by exposing each of the color conversion layers 30R, 30G, and 30B and each of the micro lenses 40 formed thereon to a total dose of light emitted from each of light emitting elements 20a, 20b, and 20c, present below them. Accordingly, the color conversion layers and the micro lenses may be manufactured to have a different thickness according to a light dose or luminance of each light emitting element, and thus may have an effect of automatically adjusting the difference of dose of light and/or the luminance per each light emitting element, while the conventional display panel including color conversion layers and/or micro lenses have the same thicknesses as each other by not considering dose or luminance difference of light emitted from each light emitting element.

As described above, the display panel according to an embodiment is manufactured by sequentially applying the photosensitive resin compositions for forming the color conversion layers 30R, 30G, and 30B or the micro lenses 40 on the substrate 10 on which the plurality of the light emitting elements 20a, 20b, and 20c are arranged to selectively drive a specific light emitting element present where each color conversion layer 30R, 30G, and 30B or micro lens 40 are formed to emit light, so that a desired region may be easily exposed and cured without a mask, which is used in the conventional photolithography method, easily forming each of the color conversion layers 30R, 30G, and 30B and the micro lens 40.

The exposure to the light emitted from the light emitting elements 20a, 20b, and 20c, and thus polymerization of the photosensitive resin compositions may occur only in a region where light emitted from each light emitting element may reach, and accordingly, the compositions may be cured only around the driven light emitting element. Accordingly, even when a photosensitive resin composition for forming a specific color conversion layer is applied to the entire substrate, since only a light emitting element in the specific subpixel region is driven to emit light, curing the photosensitive resin composition to form the specific color conversion layer only in the specific subpixel region. Subsequently, the photosensitive resin composition for forming the specific color conversion layer that is not cured in the other subpixel regions where the light emitting element is not driven may be removed through the development process, forming a pattern of the specific color conversion layer in the specific subpixel region. This color conversion layer forming process may be repeated as many times as types of color conversion layers having different emission spectra, easily forming each specific color conversion layer in all subpixel regions of the display panel according to an embodiment.

On the other hand, in order to selectively drive light emitting elements as described above, light emitting elements present in a subpixel including the same color conversion layer may be electrically connected to each other. Accordingly, the light emitting elements may be simultaneously driven to form the same color conversion layers.

The manufacturing method of the display panel of FIG. 3 is also substantially the same as the manufacturing method of the display panel of FIG. 2. However, since the display panel 200 of FIG. 3 is manufactured by firstly forming the micro lenses 40 on the light emitting elements 20a, 20b, and 20c, and then, each of the color conversion layers 30R, 30G, and 30B thereon, after first applying the photosensitive resin composition for forming the micro lenses 40 on the entire substrate 10 on which the plurality of the light emitting elements 20a, 20b, and 20c are formed, all the light emitting elements 20a, 20b, and 20c are simultaneously driven to form the micro lenses 40 around the light emitting elements 20a, 20b, and 20c, respectively. In this way, after firstly forming the micro lenses 40 on the light emitting elements 20a, 20b, and 20c, respectively, a specific color conversion layer in each subpixel may be disposed on each micro lens 40.

For example, in order to form the color conversion layer 30R including quantum dots for emitting red light in the first subpixel PX$_1$ that emits the red light, after applying the photosensitive resin composition PR1 for forming the color conversion layer 30R including the quantum dots for emitting the red light is applied on the entire substrate 10 on which the micro lens 40 are formed, the light emitting element 20a in the first subpixel PX$_1$ may be selectively driven so that the photosensitive resin composition in the first subpixel PX$_1$ region may be cured. Accordingly, the photosensitive resin composition PR1 present around the light emitting element 20a of the first subpixel PX$_1$ may be cured and developed to form the color conversion layer 30R completely surrounding the micro lens 40 on the light emitting element 20a of the first subpixel PX$_1$.

Subsequently, in order to form the color conversion layer 30G including quantum dots for emitting green light in the second subpixel PX$_2$ that emits the green light, after applying the photosensitive resin composition PR2 for forming the color conversion layer 30G including the quantum dots for emitting the green light on the entire substrate 10 on which the color conversion layer 30R and the micro lenses 40 are formed, the light emitting element 20b in the second subpixel PX$_2$ may be selectively driven, so that the photosensitive resin composition may be cured only in the second subpixel PX$_2$ region. Accordingly, the photosensitive resin composition PR2 around the light emitting element 20b of the second subpixel PX$_2$ is cured and developed, forming the color conversion layer 30G completely surrounding the micro lens 40 on the light emitting element 20b of the second subpixel PX$_2$.

In addition, in order to form a transmission layer including no quantum dots in the third subpixel PX$_3$ that emits blue light emitted by the light emitting element 20c, after applying the photosensitive resin composition PR3 for forming the transmission layer on the entire substrate 10 on which the color conversion layers 30R and 30G and the micro lenses 40 are formed, the light emitting element 20c in the third subpixel PX$_3$ is selectively driven, so that the photosensitive resin composition may be cured only in the third subpixel PX$_3$ region. Accordingly, the photosensitive resin composition PR3 only around the light emitting element 20c of the third subpixel PX$_3$ is cured and developed to form the transmission layer 30B completely surrounding the micro lens 40 on the light emitting element 20c of the third subpixel PX$_3$. The display panel manufactured in this way, as illustrated in FIG. 3, may be the display panel according to an embodiment The aforementioned photosensitive resin compositions for the color conversion layers 30R and 30G and the transmission layer 30B and the micro lenses 40 may be negative type photosensitive resin compositions polymerized and cured by light emitted by the light emitting elements 20a, 20b, and 20c, for example, blue light having a central wavelength of about 430 nanometers to about 470 nanometers.

As described above, the method of manufacturing the display panel according to an embodiment by driving the light emitting elements 20a, 20b, and 20c on the substrate to expose and cure the photosensitive resin compositions without a separate exposure mask may easily form the color conversion layers 30R, 30G, and 30B, and also a pattern with a very narrow width. Accordingly, the display panel according to an embodiment may be advantageously applied to achieve high luminance and high color purity in a display device employing each of very small light emitting elements such as micro light emitting diodes, nano light emitting diodes, and the like in each pixel.

The display panel as described above may be applied to various electronic devices, and in particular, may be advantageously used in various display devices requiring miniaturization, weight reduction, and high resolution. Applicable display devices may include display devices in various fields such as televisions, monitors, mobile devices, watches, augmented reality ("VR")/virtual reality ("AR") applied game machines, signboards, and lighting, but are not limited thereto.

Hereinbefore, the certain exemplary embodiments of the present invention have been described and illustrated, however, it is apparent to a person with ordinary skill in the art that the present invention is not limited to the exemplary embodiment as described, and may be variously modified and transformed without departing from the spirit and scope of the present invention. Accordingly, the modified or transformed exemplary embodiments as such may not be understood separately from the technical ideas and aspects of the present invention, and the modified exemplary embodiments are within the scope of the claims of the present invention.

DESCRIPTION OF SYMBOLS

1000, 100, 200: display panel,
10, 1000D: substrate,
20, 20a, 20b, 20c: light emitting element,
30R, 30G, 30B: color conversion layer,
40: micro lens
PR1, PR2, PR3, PR4: photosensitive resin composition

What is claimed is:

1. A display panel, comprising
a substrate,
a plurality of light emitting elements disposed on the substrate, each of the plurality of light emitting elements comprising a semiconductor light emitting chip,
a plurality of color conversion layers disposed on the light emitting elements, respectively, each of the color conversion layers surrounding each of the light emitting elements,
a plurality of micro lenses disposed on the color conversion layers, respectively, and
an absorption-type color filter layer disposed between each of the plurality of color conversion layers and each of the plurality of micro lenses,
wherein each of the micro lenses completely surrounds an outer surface of a corresponding color conversion layer among the color conversion layers,
wherein the outer surface is a surface of the corresponding color conversion layer exposed to an outside and includes a side surface and an upper surface of the corresponding color conversion layer.

2. The display panel of claim 1, wherein each of the micro lenses comprises a photoinitiator.

3. The display panel of claim 1, wherein the plurality of color conversion layers comprises quantum dots.

4. The display panel of claim 1, wherein the absorption-type color filter layer comprises a pigment, a dye, or a combination thereof.

5. The display panel of claim 1, wherein the display panel does not comprise a partition wall anywhere between the plurality of the light emitting elements, between the plurality of the micro lenses, or between the plurality of the color conversion layers.

6. The display panel of claim 1, wherein a distance between two adjacent light emitting elements among the plurality of the light emitting elements is less than or equal to about 100 micrometers.

7. The display panel of claim 1, wherein a central wavelength of light emitted by each of the plurality of the light emitting elements is about 430 nanometers to about 470 nanometers.

8. The display panel of claim 1, wherein the plurality of color conversion layers comprises first color conversion layers configured to convert light emitted from corresponding light emitting elements among the plurality of light emitting elements into light having a first emission spectrum, and second color conversion layers configured to convert light emitted from corresponding light emitting elements among the plurality of light emitting elements into light having a second emission spectrum that differs from the first emission spectrum, and
the light emitted from the light emitting elements corresponding to the first and second conversion layers has an emission spectrum that differs from the first emission spectrum and the second emission spectrum.

9. The display panel of claim 8, wherein the first emission spectrum is a red light emission spectrum, and the second emission spectrum is a green light emission spectrum.

10. The display panel of claim 8, wherein the plurality of color conversion layers further comprises transmission layers to transmit light emitted from corresponding light emitting elements among the plurality of light emitting elements.

11. The display panel of claim 10, wherein the light emitting elements on which the transmission layers are formed are electrically connected to each other.

12. The display panel of claim 8, wherein the light emitting elements surrounded by the first color conversion layers are electrically connected to each other, and the light emitting elements surrounded by the second color conversion layers are electrically connected to each other.

13. The display panel of claim 1, wherein
the plurality of light emitting elements comprises a plurality of micro light emitting diodes, and
the plurality of color conversion layers comprises first color conversion layers that include red light emitting quantum dots dispersed in a polymer matrix and surround corresponding micro light emitting diodes among the plurality of micro light emitting diodes.

14. The display panel of claim 1, wherein
the plurality of light emitting elements comprises a plurality of micro light emitting diodes, and
the plurality of color conversion layers comprises second color conversion layers that include green light emitting quantum dots dispersed in a polymer matrix and surround corresponding micro light emitting diodes among the plurality of micro light emitting diodes.

15. An electronic device comprising the display panel of claim 1.

* * * * *